US005499251A

United States Patent [19]
Brusewitz

[11] Patent Number: 5,499,251
[45] Date of Patent: Mar. 12, 1996

[54] METHOD OF RECOVERING LOST BITS IN A DIGITAL TRANSMISSION

[75] Inventor: Harald Brusewitz, Älvsjö, Sweden

[73] Assignee: Televerket, Farsta, Sweden

[21] Appl. No.: 327,816

[22] Filed: Oct. 17, 1994

Related U.S. Application Data

[63] Continuation of Ser. No. 969,220, filed as PCT/SE91/00519, Aug. 5, 1991, abandoned.

[30] Foreign Application Priority Data

Aug. 15, 1990 [SE] Sweden .................................. 9002646

[51] Int. Cl.$^6$ ...................................... G06F 11/00
[52] U.S. Cl. ........................... 371/37.1; 371/39.1
[58] Field of Search ............................ 371/37.1, 37.2, 371/39.1, 37.6

[56] References Cited

U.S. PATENT DOCUMENTS

| | | | |
|---|---|---|---|
| Re. 28,923 | 8/1976 | Patel | 340/146.1 AL |
| Re. 33,332 | 9/1990 | Furuya et al. | 371/37.4 |
| 4,334,309 | 6/1982 | Bannon et al. | 371/38 |
| 4,476,562 | 10/1984 | Sako et al. | |
| 4,504,948 | 3/1985 | Patel | 371/38 |
| 4,546,474 | 10/1985 | Sako et al. | 371/39 |
| 4,730,320 | 3/1988 | Hidaka et al. | 371/38 |
| 5,012,472 | 4/1991 | Arimoto et al. | 371/40.1 |

FOREIGN PATENT DOCUMENTS

| | | |
|---|---|---|
| 0154538 | 9/1985 | European Pat. Off. . |
| 0397385 | 11/1990 | European Pat. Off. . |

*Primary Examiner*—Robert W. Beausoliel, Jr.
*Assistant Examiner*—Joseph E. Palys
*Attorney, Agent, or Firm*—Oblon, Spivak, McClelland, Maier, & Neustadt

[57] ABSTRACT

The invention relates to a method of recovering lost bits in digital transmission. The invention can be applied in ATM networks or networks in which the receiver utilizes soft decoding. A number of data bits $d_1$–$d_n$ are transmitted together with a number of control bits $c_1$–$c_k$. The control bits are calculated in the transmitter using a number of parity constants $p_{11}$–$p_{kn}$ such that a corresponding number of parity relations are fulfilled. In the receiver, the positions of the lost data bits are detected and a number of syndrome bits $s_1$–$s_k$ are calculated from the transmitted data bits and control bits. Then the lost data bits can be recovered by mapping syndrome bits indicating the values of the lost data bits. By using the knowledge about the positions of the lost data bits a reduced number of control bits are required compared with the prior art.

6 Claims, No Drawings

METHOD OF RECOVERING LOST BITS IN A DIGITAL TRANSMISSION

This application is a Continuation of application Ser. No. 07/969,220, filed Feb. 12, 1993, abandoned, which was filed as International Application No. PCT/SE91/00519 on Aug. 5, 1991.

FIELD OF THE INVENTION

The present invention relates to a method of recovering lost bits in digital transmission. The invention may be applied in ATM networks or in networks wherein the receiver utilizes soft decoding.

STATE OF THE ART

For a block of n data bits k control bits are calculated, whereafter the n+k bits are transmitted. In the transmission some bits may be lost. According to the state of the art the lost bits are replaced by dummy bits which then are corrected with a conventional error correction code. The knowledge about the positions of the lost bits is not used, whereby unnecessarily many control bits have to be calculated and transmitted. In addition the error correction is often a complex method.

In contrast, the present invention utilizes the knowledge about the positions of the lost bits. Thus, the number of control bits can be reduced and a simpler method of recovering the lost bits is obtained.

SUMMARY OF THE INVENTION

Thus, the present invention provides a method of recovering lost bits in digital transmisson, wherein a number of data bits is transmitted together with a number of control bits. The control bits are calculated in the transmitter by means of a number of parity constants so that a number of parity relations are fulfilled. In the reciever the positions of the lost bits are detected and a number of syndrome bits are calculated from the transmitted data bits and control bits. The lost bits are recovered by mapping the syndrome bits indicating the value of the lost bits.

Further features of the invention are set forth in the accompanying claims.

DETAILED DESCRIPTION OF THE PREFERRED EMBODIMENTS OF THE INVENTION

The present invention may be classified among systems with "soft decoding". In a so-called soft decoding, in the first step, a decision is taken whether a recieved bit belongs to some of the following categories:

a) the recieved bit is definitely a zero, b) the recieved bit is definitely a one, c) uncertain which value the bit is.

In applying the invention the case c) is instead defined as "lost bit" Since its position is known this information should be utilized. For each bit to be recovered at least one control bit is required. The control bits are calculated by fulfilling parity relations calculated from the data bits and a number of fixed parity constants. The parity constants should be chosen such that maximal information is obtained about the data bits. The parity constants depend on the number of control bits.

| The n data bits are denoted | $d_1, d_2, \ldots d_n$. |
|---|---|
| The k control bits are denoted | $c_1, c_2, \ldots c_k$. |
| The parity constants are denoted | $p_{11}, p_{12}, \ldots p_{1n}$ |
| | $p_{21}, p_{22}, \ldots p_{2n}$ |
| | . |
| | . |
| | . |
| | $p_{k1}, p_{k2}, \ldots p_{kn}$. |

The control bits are calculated in the transmitter using the following equation $$c_i = p_{i1} \cdot d_1 + p_{i2} \cdot d_2 + \ldots + p_{in} \cdot d_n \qquad (1)$$

The equation is a rearrangement of the following parity relation (i=1 ... k)

$$0 = c_i + p_{i1} \cdot d_1 + p_{i2} \cdot d_2 + \ldots + p_{in} \cdot d_n \qquad (2)$$

"·" refers to binary multiplication (AND) that is a·b=0 if a=0 or b=0 a·b=1 if a=1 and b=1

"+" refers to addition modulo 2 (EXOR), that is the result is 0 if an even number of ones is included in the sum and 1 if an odd number of ones is included in the sum.

Lost bits are recovered in the receiver in the following way. Syndrome bits $s_i$ are calculated for i=1 ... k with the formula $$s_i = c_i' + p_{i1} \cdot d_1' + p_{i2} \cdot d_2' + \ldots + p_{in} \cdot d_n' \qquad (3)$$

The symbol ' refers to lost bits being replaced by zeros in the calculation. With knowledge about the positions about the lost bits and the values of the syndrome bits $s_i$ the values of the lost bits can be calculated.

A lost bit in position u may only be recovered if $p_{iu}=1$ for at least one value of i. It is suitable and possible to choose a parity constant in such a way. However, there are restrictions on the positions and number of lost bits which may be recovered.

EXAMPLE 1 k=1, that is one control bit is used. In this case, only one lost bit can be recovered. It is suitable that $p_{1j}=1$ for every j. If $s_1=1$ the lost bit is one. If $s_1=0$ the lost bit is a zero. If no bit is lost $s_1=0$ always (if an odd number of transmission errors has occured).

EXAMPLE 2 k=2, that is two control bits are used. In this case one, and in certain cases two, lost bits may be recovered.

A lost bit can always be recovered in position u if $p_{1u}=1$ or $p_{2u}=1$, similarly as example 1. If the lost bit is a control bit no step need be taken in the receiver.

Two lost bits may be recovered in the positions u and v if the parity constants fulfill any of the conditions a-b.

| a. | $p_{1u}\ p_{1v} = 1\ 1$ → | $(s_1,s_2) = (0,0)$ → $(d_u,d_v) = (0,0)$ |
|---|---|---|
| | $p_{2u}\ p_{2v} = 1\ 0$ | $(s_1,s_2) = (0,1)$ → $(d_u,d_v) = (1,1)$ |
| | | $(s_1,s_2) = (1,0)$ → $(d_u,d_v) = (0,1)$ |
| | | $(s_1,s_2) = (1,1)$ → $(d_u,d_v) = (1,0)$ |
| b. | $p_{1u}\ p_{1v} = 1\ 0$ → | $(s_1,s_2) = (0,0)$ → $(d_u,d_v) = (0,0)$ |
| | $p_{2u}\ p_{2v} = 0\ 1$ | $(s_1,s_2) = (0,1)$ → $(d_u,d_v) = (0,1)$ |
| | | $(s_1,s_2) = (1,0)$ → $(d_u,d_v) = (1,0)$ |

$$(s1,s2) = (1,1) \rightarrow (du,dv) = (1,1)$$

Note that the cases a-b are more general than they seem to be, in that u and v, and c1 and c2, respectively, may change positions. Thus, the following cases work as well.

```
p1u p1v = 1 1   0 1   1 0
p2u p2v = 0 1   1 1   1 1
p1u p1v = 0 1
p2u p2v = 1 0
```

Two lost bits can not be recovered in the positions u and v, if the parity constants have values according to c.

```
c.  p1u p1v = 0 0   0 1   1 1   1 0   1 1
    p2u p2v = 0 0   0 0   0 0   1 0   1 1
```

Three lost bits can never be recovered using two parity bits.

If one of the lost bits is a control bit the lost bit can be recovered as in example one. If both the lost bits are control bits no step need be taken in the receiver.

Examples are given below of choice of parity constants and their capacity of recovering lost bits
p11,12,13, . . . =1 1 0 1 1 0 1 1 0 1 1 0 1 1 0 1 1 0 .
. .
p21,22,23, . . . =0 1 1 0 1 1 0 1 1 0 1 1 0 1 1 0 1 1
. . .

Single losses: All
Double losses: Two thirds, for instance adjacent, does not work if ci does not depend on the lost bit/bits
Triple losses: None

EXAMPLE 3 k=3, that is three control bits are used.

One lost bit can be recovered in position u if it is not true that p1u=p2u=p3u=0.

Two lost bits can be recovered in positions u and v if (p1u,p1v,p2u,p2v) or (p1u,p1v,p3u,p3v) or (p2u,p2v,p3u, p3v) fulfill any of the conditions a-b in example 2.

Three lost bits can be recovered in the positions and w if
a. (p1u,p1v,p1w)=1 1 1→
   (p2u,p2v,p2w)=1 1 0
   (p3u,p3v,p3w)=0 1 1
   (s1,s2,s3)=(0,0,0)→(du,dv,dw)=(0,0,0)
   (s1,s2,s3)=(0,0,1)→(du,dv,dw)=(1,1,0)
   (s1,s2,s3)=(0,1,0)→(du,dv,dw)=(0,1,1)
   (s1,s2,s3)=(1,0,0)→(du,dv,dw)=(1,1,1)
   (s1,s2,s3)=(0,1,1)→(du,dv,dw)=(1,0,1)
   (s1,s2,s3)=(1,0,1)→(du,dv,dw)=(0,0,1)
   (s1,s2,s3)=(1,1,0)→(du,dv,dw)=(1,0,0)
   (s1,s2,s3)=(1,1,1)→(du,dv,dw)=(0,1,0)
b. (p1u,p1y,p1w)=0 1 0→
   (p2u,p2v,p2w)=1 0 1
   (p3u,p3v,p3w)=1 1 0
   (s1,s2,s3)=(0,0,0)→(du,dv,dw)=(0,0,0)
   (s1,s2,s3)=(0,0,1)→(du,dv,dw)=(1,0,1)
   (s1,s2,s3)=(0,1,0)→(du,dv,dw)=(0,0,1)
   (s1,s2,s3)=(1,0,0)→(du,dv,dw)=(1,1,1)
   (s1,s2,s3)=(0,1,1)→(du,dv,dw)=(1,0,0)
   (s1,s2,s3)=(1,0,1)→(du,dv,dw)=(0,1,0)
   (s1,s2,s3)=(1,1,0)→(du,dv,dw)=(1,1,0)
   (s1,s2,s3)=(1,1,1)→(du,dv,dw)=(0,1,1)

Other combinations, based on the two above, in which three losses can be recovered are

```
1 1 1   1 1 1   1 1 1   1 1 1   1 1 1   1 1 1
1 0 1   0 1 1   1 1 0   0 1 1   1 0 1   1 1 0
0 1 1   1 0 1   0 1 1   1 1 0   1 1 0   1 0 1
1 0 1   0 1 1   1 1 0   0 1 1   1 0 1   1 1 0
1 1 1   1 1 1   1 1 1   1 1 1   1 1 1   1 1 1
0 1 1   1 0 1   0 1 1   1 1 0   1 1 0   1 0 1
1 0 1   0 1 1   1 1 0   0 1 1   1 0 1   1 1 0
0 1 1   1 0 1   0 1 1   1 1 0   1 1 0   1 0 1
1 1 1   1 1 1   1 1 1   1 1 1   1 1 1   1 1 1
0 1 0   0 0 1   1 0 0   1 0 0   0 0 1   0 1 0
1 0 1   1 1 0   0 1 1   0 1 1   1 1 0   1 0 1
1 1 0   1 0 1   1 1 0   1 0 1   0 1 1   0 1 1
1 0 1   1 1 0   0 1 1   0 1 1   1 1 0   1 0 1
0 1 0   0 0 1   1 0 0   1 0 0   0 0 1   0 1 0
1 1 0   1 0 1   1 1 0   1 0 1   0 1 1   0 1 1
1 1 0   1 0 1   1 1 0   1 0 1   0 1 1   0 1 1
0 1 0   0 0 1   1 0 0   1 0 0   0 0 1   0 1 0
```

Three losses cannot be recovered in the positions u, v and w if
(p1u,p1v,p1w)=1 0 1
(p2u,p2v,p2w)=1 1 0
(p3u,p3v,p3w)=0 1 1

Examples are given be,low of choice of parity constants and their respective capacity of recovering lost bits.
p11,p12,p13, . . . =1 1 1 1 1 1 1 1 1 1 1 1 1 1 1 1 1 1
. . .
p21,p22,p23, . . . =1 1 0 1 1 0 1 1 0 1 1 0 1 1 0 1 1
. . .
p31,p32,p33, . . . =0 1 1 0 1 1 0 1 1 0 1 1 0 1 1 0 1
. . .

Single losses: All
Double losses: Two thirds, for instance two adjacent
Triple losses: One third, for instance three adjacent
p11,p12,p13, . . . =1 1 1 0 1 1 1 0 1 1 1 0 1 1 1 0 1 1 1 0
. . .
p21,p22,p23, . . . =1 1 0 1 1 1 0 1 1 0 1 1 1 0 1 1 1 0 1 1
. . .
p31,p32,p33, . . . =0 1 1 1 0 1 1 1 0 1 1 1 0 1 1 1 0 1 1 1
. . .

Single losses: All
Double losses: Three fourths, for instance two adjacent
Triple losses: 9/32, for instance ¾ of all adjacent

Example of application—Cell loss in ATM networks

In packet transmission in ATM-networks so-called 'cells' are transmitted, consisting of a heading (not dealt with here) and a data field consisting of 384 bits. According to a decision of ETSI-NA5 four of these data bits are a 'cell number' that can assume values between 0 and 15. If the receiver detects that a cell number is missing, the cell having this number is lost in the transmission. Thereby the position of the cell is known. By letting one or more cells be 'control cells' lost cells can be recovered using the technique of the invention. The technique of the invention is thereby applied "across" cells, illustrated by an example (k=1) in the table below.

| 4 bits | 380 bits | |
| --- | --- | --- |
| no = 0 | data bits | d0 |
| no = 1 | data bits | d1 |
| no = 2 | data bits | d2 |
| no = 3 | data bits | d3 |
| no = 4 | data bits | d4 |
| no = 5 | data bits | d5 |
| no = 6 | data bits | d6 |
|  | lost cell | x = d7' |
| no = 8 | data bits | d8 |
| no = 9 | data bits | d9 |
| no = 10 | data bits | d1 |
| no = 11 | data bits | d1 |
| no = 12 | data bits | d1 |
| no = 13 | data bits | d1 |
| no = 14 | data bits | d1 |
| no = 15 | control bits | c1 |

Using the control bit $c_i$ and data bits $d_0$–$d_6$ and $d_8$–$d_{14}$ the lost bit $x=d_7'$ can be recovered. The same technique is used for all the 380 data bits. The cell number is not replaced by control bits.

Thus, the present invention provides an efficient method of recovery in lost data bits in digital transmission. Using the present description, a person skilled in the art can realize the invention by means of existing components and equipment. In a preferred embodiment the syndrome bits are mapped on the data bits in accordance with the tables above by reading in a look-up table in the receiver, but other ways are also possible. The invention is only limited by the accompanying claims.

What is claimed is:

1. A method of recovering at least one lost bit in a digital transmission, wherein a number of data bits ($d_1 \ldots d_n$) are transmitted together with at least one control bit ($c_1 \ldots c_k$), comprising the steps of:

calculating at least one control bit in a transmitter using a number of parity constants ($p_{11} \ldots p_{kn}$) so that a corresponding number of parity relations are fulfilled according to $c_i = p_{i1} \cdot d_1 + p_{i2} \cdot d_2 + \ldots + p_{in} \cdot d_n$, outputting from the transmitter plural data bits and the at least one control bit;

inputting into a receiver the plural data bits and the at least one control bit, the plural data bits and the at least one control bit having at least one lost bit;

detecting in the receiver, at least one position of the at least one lost bit, calculating at least one syndrome bit ($s_1 \ldots s_k$) from the transmitted data bits and the at least one control bit, the each of the at least one syndrome bit is calculated as $s_i = c_i' + p_{i1} \cdot d_1' + p_{i2} \cdot d_2' + \ldots + p_{in} \cdot d_n'$, a prime symbol denoting that a lost bit is replaced by zero; and recovering the at least one lost bit by mapping the at least one syndrome bit ($s_1 \ldots s_k$) indicating the value of the at least one lost bit.

2. A method according to claim 1, wherein the number of control bits is k=1 and the parity constants are $p_{11} = p_{12} = \ldots = p_{1n} = 1$.

3. A method according to claim 1, wherein the number of control bits is k=2 and the parity constants are
$p_{11}, p_{12}, p_{13}, \ldots = 1\ 1\ 0\ 1\ 1\ 0\ 1\ 1\ 0 \ldots$
$p_{21}, p_{22}, p_{23}, \ldots = 0\ 1\ 1\ 0\ 1\ 1\ 0\ 1\ 1 \ldots$ 4. A method according to claim 1, wherein the number of control bits is k=3 and the parity constants are
$p_{11}, p_{12}, p_{13}, \ldots = 1\ 1\ 1\ 1\ 1\ 1\ 1 \ldots$
$p_{21}, p_{22}, p_{23}, \ldots = 1\ 1\ 0\ 1\ 1\ 0\ 1 \ldots$
$p_{31}, p_{32}, p_{33}, \ldots = 0\ 1\ 1\ 0\ 1\ 1\ 0 \ldots$ 5. A method according to claim 1, wherein the number of control bits is k=3 and the parity constants are
$p_{11}, p_{12}, p_{13}, \ldots = 1\ 1\ 1\ 0\ 1\ 1\ 1\ 0\ 1\ 1\ 1\ 0 \ldots$
$p_{21}, p_{22}, p_{23}, \ldots = 1\ 1\ 0\ 1\ 1\ 1\ 0\ 1\ 1\ 1\ 0\ 1 \ldots$
$p_{31}, p_{32}, p_{33}, \ldots 32\ 0\ 1\ 1\ 1\ 0\ 1\ 1\ 1\ 0\ 1\ 1\ 1 \ldots$ 6. A method according to claims 1, 2, 3, 4 or 5, further comprising:

mapping the at least one syndrome bit ($s_1 \ldots s_k$) using a look-up table in the receiver.

\* \* \* \* \*